United States Patent [19]
Wang et al.

[11] Patent Number: 5,475,262
[45] Date of Patent: Dec. 12, 1995

[54] FUNCTIONAL SUBSTRATES FOR PACKAGING SEMICONDUCTOR CHIPS

[75] Inventors: Wen-chou V. Wang; William T. Chou, both of Cupertino, Calif.

[73] Assignee: Fujitsu Limited, Japan

[21] Appl. No.: 97,039

[22] Filed: Jul. 27, 1993

Related U.S. Application Data

[63] Continuation-in-part of Ser. No. 927,151, Aug. 7, 1992.

[51] Int. Cl.$^6$ ............... H01L 23/48; H01L 23/02; H01L 29/44
[52] U.S. Cl. ............... 257/698; 257/691; 257/773; 257/523; 257/536; 437/209; 437/217
[58] Field of Search ............... 257/691, 698, 257/773, 278, 523, 536; 437/209, 217, 915

[56] References Cited

U.S. PATENT DOCUMENTS

| | | | |
|---|---|---|---|
| 3,748,548 | 7/1973 | Haisty et al. | 317/235 |
| 4,649,417 | 3/1987 | Burgess et al. | 357/80 |
| 4,945,399 | 7/1990 | Brown | 357/74 |
| 4,949,163 | 8/1990 | Sudo et al. | 357/80 |
| 4,991,000 | 2/1991 | Bone et al. | 357/75 |
| 5,013,687 | 5/1991 | Solomon | 437/209 |
| 5,032,896 | 7/1991 | Little et al. | 357/75 |
| 5,055,907 | 10/1991 | Jacobs | 357/71 |
| 5,082,802 | 1/1991 | Gelsomini | 437/217 |

FOREIGN PATENT DOCUMENTS

| | | |
|---|---|---|
| 0268111 | 5/1988 | European Pat. Off. . |
| 0379404 | 7/1990 | European Pat. Off. . |
| 0414204 | 2/1991 | European Pat. Off. . |

OTHER PUBLICATIONS

Magdo, S., "Low Inductance Module", *IBM Technical Disclosure Bulletin*, 1978, vol. 21, No. 5, pp. 1895–1897.

Goldmann, L. S., "Universal Electronic Package", *IBM Technical Disclosure Bulletin*, 1984, vol. 27, No. 6, pp. 3335–3336.

*Primary Examiner*—Rolf Hille
*Assistant Examiner*—Valencia Martin Wallace
*Attorney, Agent, or Firm*—Christie, Parker & Hale

[57] ABSTRACT

A semiconductor device is manufactured by subdividing the chip carrier into a plurality of functional substrates, such as a signal connection substrate, a capacitor substrate, a resistor substrate and a power supply substrate. The several substrates are individually manufactured and tested before they are assembled. Advantageously, the manufacturing and testing of the substrates are carried out in parallel, so as to reduce manufacturing time of the semiconductor device.

Each substrate has a top interconnect layer and a bottom interconnect layer. Each interconnect layer has a plurality of bond pads in an identical pattern. The pads are formed using the same design rules, structure, pitch, diameter and fabrication process for each layer. This identity allows the different functional substrates to be electrically interchanged without changing the interconnection layers. Although changes internal in the substrate may be required.

13 Claims, 11 Drawing Sheets

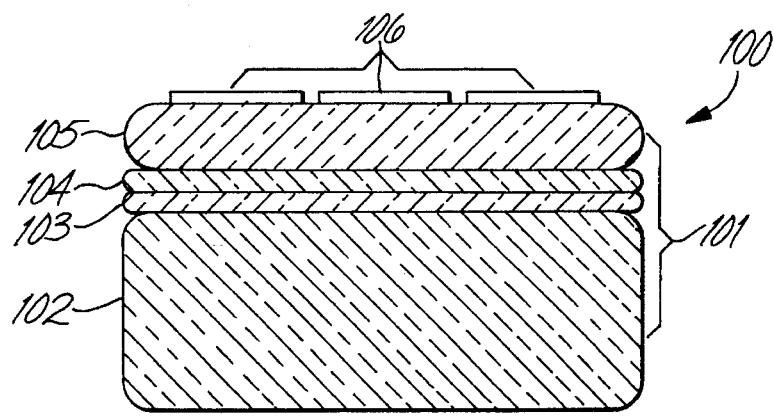
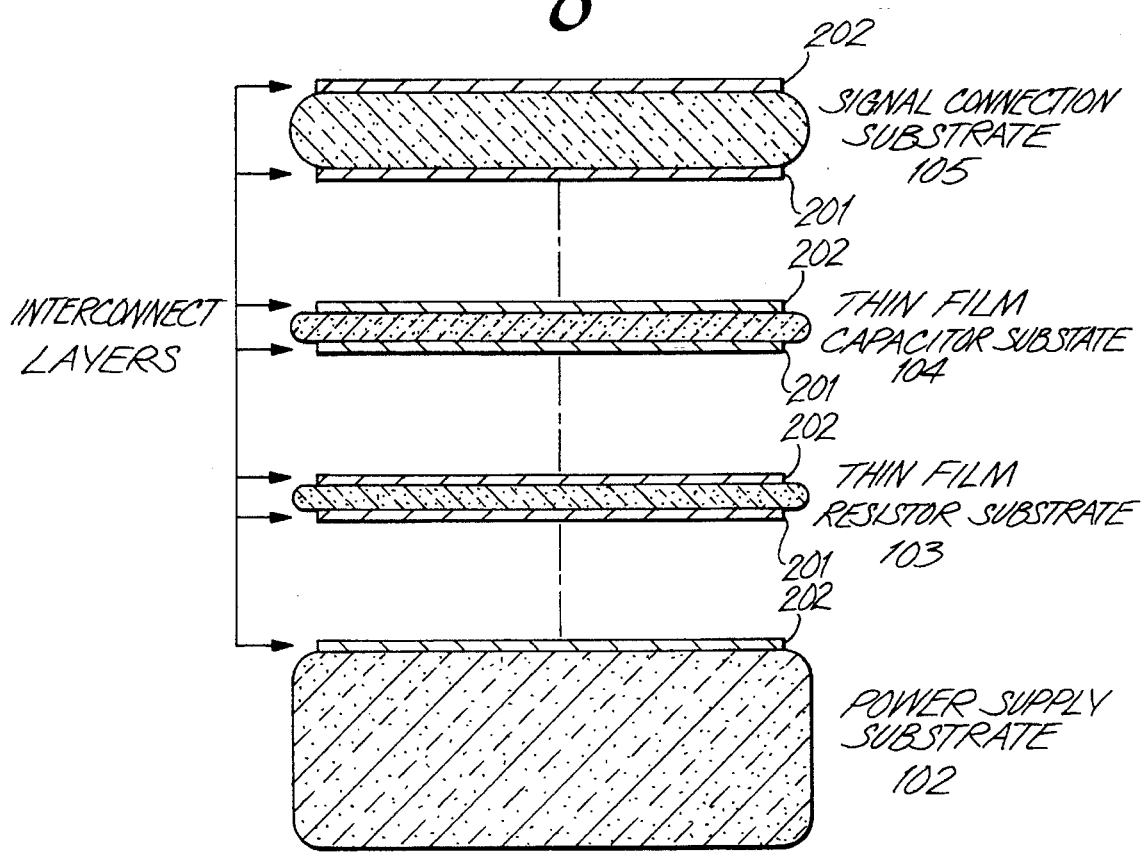

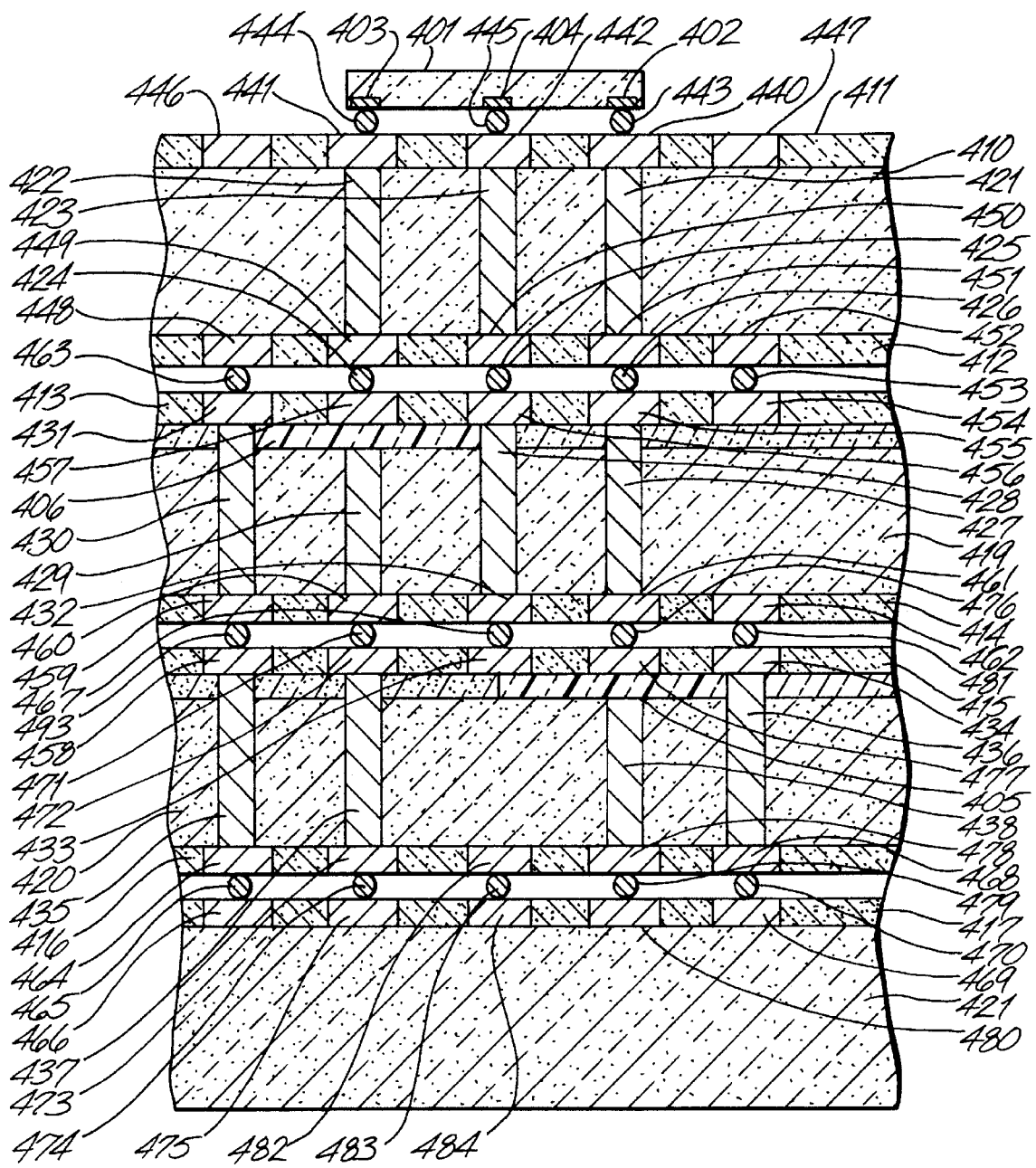

FUNCTIONAL SUBSTRATES FOR PACKAGING SEMICONDUCTOR CHIPS

CROSS REFERENCE TO RELATED APPLICATION

This patent application is a continuation-in-part of application Ser. No. 07/927,151, filed Aug. 7, 1992, the subject matter of which is incorporated herein by this reference.

TECHNICAL FIELD

The present invention relates generally to packaging of semiconductor devices and specifically to a design of chip carriers that facilitates the manufacture of semiconductor devices.

BACKGROUND OF THE INVENTION

Several prior art methods exist for manufacturing semiconductor devices in packages. FIG. 10 is a flow chart illustrating the prior art of manufacturing multi-chip modules using a deposition method (MCM-D). In this method, layers of a substrate are built sequentially one on top of another. After each layer is built, each layer is tested. In a manner well known in the art, a power substrate is first built (step 1001). After manufacture, the power substrate is tested (step 1002). The next layer, a thin film substrate 1 (TFS1), is deposited on the top surface of the power substrate in a manner well known in the art (step 1003). The partially assembled substrate is tested (step 1004). If the partially assembled substrate fails the test, it must be either reworked or discarded. In the latter alternative, a good power substrate is discarded as part of the failed partially assembled substrate. A second thin film substrate (TFS2) is deposited on the first thin film substrate (TFS1) (step 1005) and tested (step 1006). As with the first thin film substrate, the entire partially assembled substrate must be reworked or discarded if it fails the test at step 1006. This process is continued until the Nth layer of the thin film substrate (TFSN) is deposited on the sequentially assembled substrate (step 1007) and tested (step 1008). Parallel to the assembly of the substrate, the chip is assembled (step 1009) and tested (step 1011). After the substrate is assembled and successfully tested, the successfully tested chip is attached to the substrate using a chip attachment technique which is well known in the art (step 1012).

This MCM-D assembly process allows high density interconnections because the deposition process uses standard photolithography techniques which provide small signal traces, small intertrace distances, and close alignment between successive substrate layers. However, this method has several drawbacks. First, a layer requiring a higher annealing temperature must be manufactured before layers requiring lower annealing temperatures thereby imposing potentially severe limitations upon the design and packaging of the semiconductor devices. For example, a thin film capacitor layer made from tantalum pentoxide ($Ta_2O_5$) is annealed at temperatures between 600° and 800° centigrade for approximately one minute. The other substrate layers are typically made of other dielectrics which typically have lower stability temperatures. For example, one typical material is polyimide which is stable up to 400° centigrade. Thus, the thin film capacitor layer must be made before the polyimide layers and consequently the capacitor layer can not be the top layer. For some electrical circuits, it is desirable that the capacitor layer be as close to the chip as possible. In this instance, the physical limitations of the substrate limit the electrical performance of the corresponding circuit.

Second, sequentially building the layers using an MCM-D method also provides low overall yields. For example, if one layer has a manufacturing yield of 90% and a second layer has a manufacturing yield of 90% the average overall yield of manufacturing the two layers is 81%. As the number of layers increases, the overall yield correspondingly decreases. In some designs, one module layer may have a yield on the order of 50%. If this layer is built at a later stage, a large number of good partially assembled layers are discarded after the low yield layer is added. Thus, to reduce the manufacturing costs, low yield layers are typically designed to be one of the first manufactured layers. This places additional constraints on the electrical design of the semiconductor device and package.

FIG. 11 is a flow chart illustrating the prior art of fabricating a multi-chip module using a laminated method (MCM-L). Unlike the MCM-D method, the MCM-L method manufactures layers in parallel. The first through the Nth thin film substrates (TSFI . . . TSFN) are manufactured in parallel (steps 1101, 1102, 1103). In addition, the power substrate is also manufactured in parallel (step 1104). Each substrate layer is subsequently individually tested (steps 1106, 1107, 1108, 1109). After successfully passing testing, the substrate layer is stripped from the thin film substrates to form a thin layer of deposited material containing interconnection traces and vias (steps 1111, 1112, 1113). The thin layers are then combined with the power substrate to form the substrate layer (step 1114). This combination requires that an interconnection contact on one substrate layer to be electrically connected to a corresponding bond pad on another substrate layer. To laminate the layers together, the layers are lined up so that the bond pads are opposite each other in spaced apart relation. A bonding material such as epoxy is placed between the substrate layers and cured to provide a rigid mechanical structure. To connect the spaced apart bond pads, the rigid structure is drilled to form a bore that extends through the electrical conductors that are to be connected from one surface of the rigid structure to another surface on the opposite side of the rigid structure (step 1116). The bores are then metallized by plating or other processes known in the art to thereby provide an electrical path between the bond pads on separate substrate layers (step 1117). In a manner similar to that described above in FIG. 10, the chips are assembled (step 1118) and tested (step 1119). Chips passing electrical test are then coupled to the carrier (step 1120).

The MCM-L method has many drawbacks. First, the stripped thin film substrate layers are thin and flexible so that when the substrate layers are handled while placing them in spaced apart relation, the layers tend to warp. The warping causes corresponding bond pads to become misaligned. Second, the process of placing bonding material between substrate layers limits the minimum thickness of the assembled substrate. Third, the rigid mechanical structure is mechanically drilled. Mechanical drill bits have a smallest diameter of about 150 microns. This limits the pitch between the electrical conductors in the substrate.

If a semiconductor device can be divided into separate layers that are capable of being manufactured and tested individually, drawbacks including those identified above are circumvented. For example, two layers requiring different annealing temperatures can be manufactured individually and then combined into a final product. Moreover, as devices are formed by combining only those layers which have already been tested, overall yield will be limited only by the yield of the assembling step, and should thus even be higher than 90%.

Furthermore, as individual layers are manufactured and tested in parallel, manufacturing time of a device is shortened.

SUMMARY OF THE INVENTION

In one aspect, the present invention relates to a chip carrier for use in packaging a semiconductor device. The carrier comprises a first substrate for carrying at least one semiconductor chip of integrated circuits and at least one independently manufactured second substrate directly coupled to the first substrate. The second substrate has predetermined electrical functional elements for connection to the integrated circuits of the semiconductor chip.

Advantageously, each second substrate has a top and a bottom interconnect layer with substantially identical patterns of bond pads so that addition and removal of a second substrate, as well as arrangement of the second substrate(s) in forming a device can be achieved conveniently.

In another aspect, the present invention relates to a process for manufacturing a semiconductor device having at least one semiconductor chip of integrated circuits. The process comprises the steps of forming a first substrate that carries the at least one semiconductor chip, forming at least one individual second substrate having a plurality of electrical functional elements, and coupling the first substrate directly to the second substrate to form a carrier for carrying the chip.

In yet another aspect, the present invention relates to a multi-chip module having an interconnection substrate and a plurality of integrated circuit elements coupled thereto. Each integrated circuit element has a semiconductor chip and at least one functional substrate. Each functional substrate is created independently and has predetermined electrical functional elements for coupling to the semiconductor chip and the interconnection substrate.

BRIEF DESCRIPTION OF THE DRAWINGS

FIG 1 shows schematically a cross-sectional illustration of a semiconductor device in which the present invention is embodied.

FIG. 2 shows schematically a cross-sectional illustration of the semiconductor device of FIG. 1 with the substrates separated.

FIGS. 4a and 4b show schematically an exemplary implementation of the present invention.

DESCRIPTION OF THE SPECIFIC EMBODIMENT

Figure 3:
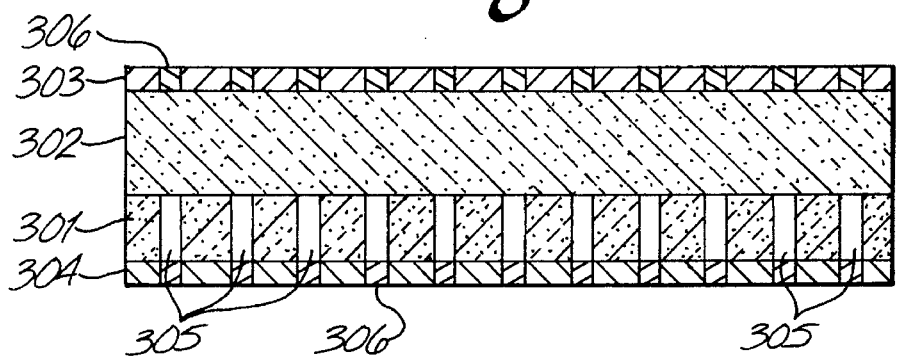
FIG. 3 shows schematically a cross-sectional illustration of the general structure of a substrate as shown in FIG. 1.

A feature of this invention is the creation of a carrier for integrated circuit chips or the like from a plurality of interconnected substrates. Four types of substrates are employed in a typical circuit. Each substrate has an identical pattern of bonding pads on each face. The substrates in an exemplary carrier are bonded together face-to-face by way of the bonding pads. Circuits are assembled by electrical connections through and between the substrates.

An interconnection substrate has an identical pattern of bond pads on its top and bottom faces. In an exemplary interconnection substrate some of the bond pads on one face are connected directly to opposite bond pads on the other face. Some of the bond pads on the top face may be connected to bond pads on the bottom face which are not opposite. Thin film conductors in the interconnection substrate interconnect such non-opposite bond pads. Some of the bond pads may not be connected to anything in a specific embodiment. The interconnections within a specific interconnection substrate are produced for a specific circuit configuration.

Another type of substrate is a capacitor substrate. It also has identical patterns of bond pads on its top and bottom faces. Some of these bond pads are connected to terminals of thin film capacitors built into the capacitor substrate. Which pads are connected to capacitors of specific values is a feature of the circuit in which the capacitor substrate is to be used.

A third type of substrate is the resistor substrate. It, too, has identical patterns of bond pads on its top and bottom faces. Thin film resistors are formed within the substrate. Such resistors are connected to bond pads in an arrangement suitable for a specific circuit to be assembled from such substrates.

The final common type of substrate is a power supply substrate. It has a pattern of bond pads on its top face identical to the bond pad pattern on the other substrates. Functional circuit elements such as ground connections, power supplies and the like may be formed in the power supply substrate.

This permits, for example, a substrate with resistors to be fabricated and tested without regard for the other circuit elements to be connected to it.

A collection of such substrates are then assembled in a face-to-face stack with the bond pads on adjacent substrates being bonded together. Typically an interconnection substrate is at the top of the stack. Integrated circuit chips are mounted on the interconnection substrate with the chip leads being connected to selected bond pads on the bottom of the substrate, either directly through the substrate or to more remote pads by way of interconnecting leads built into the substrate.

A power supply substrate is usually the bottom of the stack for heat dissipation. In between are resistor substrates and capacitor substrates sandwiched face-to-face.

Circuits are "assembled" by way of connections in the various substrates to interconnect active circuit element leads with capacitors, resistors, ground, etc. as required. This can be contrasted to assembling the circuit by connecting the active elements to discrete components such as capacitors, resistors, etc. It also can be contrasted with devices made where separate capacitor, resistor and active circuit element layers are sequentially formed on a single substrate. The separate substrates can be manufactured separately in the most cost effective way and each substrate can be tested before it is put into the assembled device.

In effect, the assembly of substrates resembles an integrated circuit where the active components (e.g. transistors), capacitors and resistors are all formed and interconnected on a single substrate with successive thin film layers. It differs in that the connections between adjacent layers are by feedthroughs or vias extending through the respective substrates since the layers themselves are on different substrates. It also differs in that the integrated circuit chips are secured to an interconnection substrate or directly to a functional substrate instead of being integral with the substrate. This enables the interconnection of numerous chips on a substrate. Signal transit times remain short since the functional substrates are thin.

FIG. 1 shows schematically a cross-sectional view of a semiconductor device 100 in which the present invention is embodied. The semiconductor device 100 comprises a chip carrier 101 having a plurality of functional substrates, such as a power supply substrate 102, a thin film resistor substrate 103, a thin film capacitor substrate 104, and a signal connection substrate 105. As will be described below, each functional substrate is electrically and physically coupled to substrates adjacent to its top and bottom surfaces.

The functional substrates 102, 103, 104, 105 need not be arranged as shown in FIG. 1, but can in general be arranged in other configurations and sequences, depending upon the requirements of a particular device.

A plurality of semiconductor chips 106 are electrically coupled to the top surface of the top functional substrate. As shown in FIG. 1, the chips 106 are attached to the signal connection substrate 105.

FIG. 2 is a schematic cross-sectional view of the semiconductor device 100 showing the substrates 102, 103, 104, 105 separated. As shown, each of these substrates, with the exception of the power supply substrate 102, has a top interconnect layer 201 and a bottom interconnect layer 202 for electrically communicating with a respective bottom interconnect layer 201 and a top interconnect layer 202 of an adjacent functional substrate.

The power supply substrate 102 is shown to have only a top interconnect layer. This is because power supply circuits are typically placed at the bottom of a semiconductor device to facilitate heat dissipation. If needed, the power supply substrate 102 can also have both a top and a bottom interconnect layer similar to the resistor substrate or the capacitor substrate.

The general structure of each of the substrates 102, 103, 104 and 105 is shown in more detail in the cross-sectional view of FIG. 3. Each of these substrates has a plurality of predetermined functional elements formed in one or more thin film layers 302 on top of a wafer 301. The relative dimensions of features shown in FIG. 3 are exaggerated to facilitate illustration thereof.

For a capacitor substrate 104, a plurality of capacitors is formed within the thin film layers 302. An exemplary structure of a thin film capacitor can be found on pages 19-3 and 19-28 of *Handbook of Thin Film Technology,* by Leon I. Maissel and Reinhard Glang; McGraw-Hill Publishing Company; 1983 Reissue. The capacitors can be used, for example, as bypass capacitors by circuits within the semiconductor chip(s) 106 to be coupled to the chip carrier 101.

For a resistor substrate 103, a plurality of resistors is formed in the thin film layer 302. An exemplary structure of a thin film resistor can be found on page 18-35 of Maissel, et al. The resistors can be used, for example, as terminating resistors or pull-up resistors by circuits within the semiconductor chip(s) 106 to be coupled to the chip carrier 101.

Referring again to FIG. 3, a top interconnect layer 303 is formed on top of the thin film layer 302 of each of the substrates 102, 103, 104, 105. A bottom interconnect layer 304 is formed on the bottom of the wafer 301 of each of the substrates 102, 103, 104. One such interconnection is found in Rao R. Tummala and Eugene J. Rymaszewski, *Microelectronics Packaging Handbook,* chapter 6, p. 366, Van Norstrand Reinhold, New York, 1989. The top interconnect layer 303 and the bottom interconnect layer 304 each have substantially identical bond pads 306 on the top and bottom surfaces, respectively. The plurality of bond pads 306 on the top interconnect layer 303 and the bottom interconnect layer 304 are arranged in identical patterns to each other so that the top interconnect layer 303 of any substrate may be electrically and physically coupled to the bottom interconnect layer 304 of any other substrate. As will be described below in connection with FIG. 4, the identical pattern allows the substrates to be interchanged. In addition, the interconnect layers 303, 304 are formed using the same metallurgy, the same design rules, and the same fabrication processes for each layer. Consequently, once the substrates are formed, the interconnect layers 303, 304 are formed using the same process. Furthermore, the physical structure of the interconnect layers 303, 304 are identical. Because of this identity, when the layers are electrically connected together, a uniform force may be applied across the surfaces of the layers to achieve electrical contact. The bond pads can be deformable bumps or other electrical connectors made of such materials such as solder, conductive elastomer or gold.

To connect the functional elements within a substrate to the bottom interconnect layer 304 or to connect the top interconnect layer 303 to the bottom interconnect layer 304, intra-substrate connections such as through-hole connectors 305 are formed in the wafer 301 of each substrate. The through-hole connections can be formed using known techniques such as drilling, reactive ion etching or plasma etching to form a hole (see supra page 4, line 29 of the article by Tummala, et al.). The holes are then filled with conductive metal. The conductive material selected to fill or metallize the through-hole may include metals, alloys of metal, metal-nonmetal compositions, and the like. The through-hole may be metallized by using deposition techniques well known to those skilled in the art such as chemical vapor deposition, plasma deposition, electroplating, metal organic chemical vapor deposition, and the like.

The power supply substrate 102 has power supply circuits formed on a wafer 301. The power supply substrate has a top interconnect layer 303, but no bottom interconnect layer 304, because the power supply substrate 102 is typically placed at the bottom of a semiconductor device. In general, however, a bottom interconnect layer can be provided as in the other functional substrates if required by a particular design.

The above-described substrates can be manufactured and tested individually and separately as described below in conjunction with FIG. 5. After they have been tested, two or more substrates can then be bonded together (e.g., by solder) to form a semiconductor device.

Figure 4A:
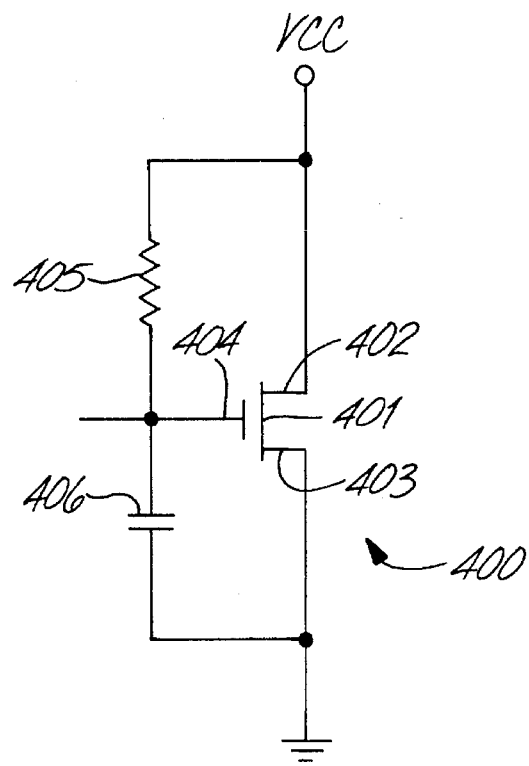

An exemplary implementation of the present invention is illustrated in FIGS. 4a and 4b.

FIG. 4a is a schematic circuit diagram of a device 400 which comprises a field effect transistor 401 having a drain terminal 402, a source terminal 403, and a gate terminal 404. The gate terminal 404 is connected through a resistor 405 to a power supply VCC to which the source terminal 402 is also connected. The gate terminal 404 is also connected through a capacitor 406 to a ground to which the source terminal 403 is also connected.

Figure 4C:
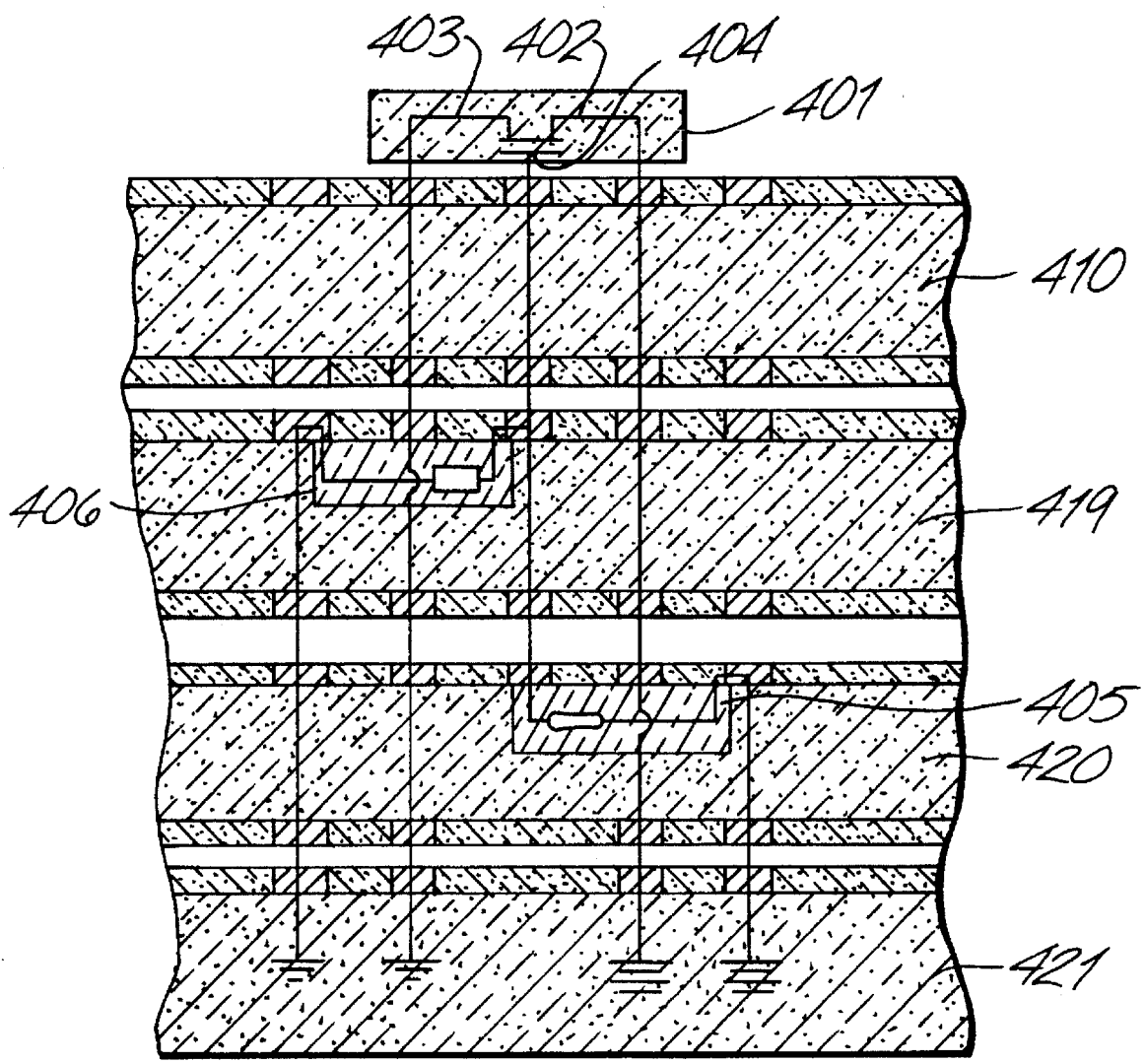
FIG. 4c is an alternate schematic illustration of how the circuit of FIG. 4a is formed in the structure of FIG. 4b.

FIG. 4b is a cross sectional view of the semiconductor device illustrating how the device 400 of FIG. 4a can be implemented according to the present invention. FIG. 4c is an alternate schematic illustration of the structure of FIG. 4b to more clearly show how the circuit 400 of FIG. 4a is formed by the structure of FIG. 4b.

Referring to FIG. 4b, the field effect transistor 401 is fabricated by methods well known to those skilled in the art on a semiconductor chip. The field effect transistor may be just one element of a complex integrated circuit on the chip. Only the field effect transistor need be illustrated as an exemplary active circuit element. The drain terminal 402, the source terminal 403, and the gate terminal 404 of the transistor 401 are formed on the bottom surface of the chip 401. The drain, the source, and the gate terminals of the transistor are bonded to respective bond pads 440, 441, 442 on a top interconnect layer 411 of the signal connection substrate 410 by connectors 443, 444, 445, respectively. The connectors 443, 444, 445 may be deformable bumps or other electrical connectors as described above in conjunction with FIG. 3. In this specific implementation, no interconnections are made within the signal connection substrate 410. Signals communicated from the three terminals 402, 403 and 404 of the field effect transistor 401 pass from the top interconnect layer 411 of the signal connection substrate 410, by way of three separate through-hole connections 421, 422 and 423 through the wafer, to the bottom interconnect layer 412. Bond pads 446, 447 on the top interconnect layer 411 are unused in this example but form part of the identical pattern of bond pads on the interconnect layer 412.

In the specific implementation of FIG. 4b, a thin film capacitor substrate 419 is mounted below the signal connection substrate 410. A top interconnect layer 413 on the top surface of the capacitor substrate 419 has a plurality of bond pads 431, 457, 456, 455, 454 arranged in a pattern identical to the pattern of a plurality of bond pads 459, 460, 432, 461, 462, respectively, on a bottom interconnect layer 414 mounted on the bottom surface of the capacitor substrate 419. The identicalness of the bond pads on the interconnect layers is described above. In addition, the top interconnect layer 413 of the capacitor substrate 419 is identical to the top interconnect layer 411 and the bottom interconnect layer 412 of the signal connection substrate layer 419.

Bond pads 448, 449, 450, 451, 452 on the bottom interconnect layer 412 are bonded to the respective bond pads 431, 457, 456, 455, 454 on the top interconnect layer 413 by respective connectors 463, 424, 425, 426, 453. Electrical signals are communicated between the terminals 402, 403, 404 of the transistor 401 and the respective bond pads 455, 457, 456 on the top interconnect layer 413. It should be noted that although the bond pads 424, 452, 454 are unused by the circuit, they are nonetheless connected to the corresponding bond pad in the adjacent interconnect layer.

Within the thin film capacitor substrate 419, a plurality of capacitors 406 are formed in a thin film layer, although only one of these capacitors is shown for reason of clarity. The capacitor 406 is shown as a lumped circuit element for simplicity. The capacitor 406 typically comprises two parallel spaced apart layers of metal with a dielectric layer sandwiched between the two metal layers. The gate 404, which is coupled to the bond pad 456, is connected to one terminal of a capacitor 406. The other terminal of the capacitor 406 is connected to the bond pad 431. Thus a signal path is formed from the gate 404 to the bond pad 456 and running through the capacitor 406 to the bond pad 431.

From the bond pad 431, the signal path of the gate passes through the capacitor substrate 419 by way of a through-hole connection 430 to a bond pad 459 on the bottom interconnect layer 414 which is mounted on the bottom surface of the capacitor substrate 419. The signal path continues through a connector 493 to a bond pad 458 in a top interconnect layer 415 of the resistor substrate 420. From the bond pad 458, the signal path passes through the resistor substrate 410 by way of a through hole connection 435 to a bond pad 464 in a bottom interconnect layer 420 on the bottom surface of the resistor substrate. The signal path continues through a connector 465 to a bond pad 466 on a top interconnect layer 417 on the top surface of the power supply substrate 421, where it is connected to ground. Connection to ground may be accomplished through a top interconnect layer having signal lines that connect to an external ground, or as in more complicated circuits, to a circuit fabricated within the power supply substrate 421.

The gate signal at the bond pad 456 is also connected by way of a through-hole connection 428 to a bond pad 432 on the bottom interconnect layer 414 of the capacitor substrate 419 where it is bonded to a bond pad 433 of the resistor substrate 420 by a connector 467.

Within the thin film resistor substrate 420, a plurality of resistors 405 are formed in a thin film layer, although only one of these resistors is shown for reason of clarity. Consequently, the signals from the gate 404 are translated through the signal connect substrate 410 and the capacitor substrate 419 on through-hole connections 422, 428, respectively, to the bond pad 433. A first terminal of the resistor 405 fabricated within the thin film layer is connected to the bond pad 433. A second terminal of the resistor 405 is connected to a bond pad 434 on the top interconnect layer 415. Thus a signal path is formed from the gate 404 to bond pads 425 and 433 successively, running through the resistor 405 to the bond pad 434. Although not functionally used, a bond pad 462 in the bottom interconnect layer 414 is connected by a connector 481 to the bond pad 434.

From the bond pad 434, this signal from the gate 404 is connected, by way of a through-hole connection 436, and a bond pad 468 to a bond pad 469 by a connector 470. The bond pad 469 is connected to the power supply VCC (not shown) in the power supply substrate 421. Connection to the power supply VCC may also be accomplished through a top interconnect layer having signal lines that connect to an external power supply VCC.

The source terminal 403 from the chip 401 is bonded by a connector 444 to the bond pad 441 on the top interconnect layer 417 of the signal connection substrate 410. From the source terminal 403 the source signal passes through the connector 444 to the bond pad 441 on the top interconnection layer 411. From the bond pad 441 the source signal passes through the signal connection substrate 410 along a through-hole connection 423 to a bond pad 449 on the bottom interconnect layer 412. From the bond pad 449 the signal passes through a connector 424 to a bond pad 457 on the top interconnect layer 413 of the capacitor substrate 419. The source signal passes through the capacitor substrate 419 through the through-hole connection 429 to a bond pad 460 on the bottom interconnect layer 414. The source signal continues from the bond pad 460 through a connector 471 to a bond pad 472 on the top interconnect layer 415 of the resistor substrate 420. The source signal passes through the resistor substrate 420 along a through-hole connection 437 and a bond pad 473 on the bottom interconnect layer 416 where it is transferred through a connector 474 to a bond pad 475 on the top interconnect layer 417 of the power substrate 421. The bond pad 475 is connected to ground. Connection to ground may also be accomplished through a top interconnect layer having signal lines that connect to an external ground.

In a manner similar to that described above for the source terminal 403, the signals from the drain terminal 402 passes through the signal connection substrate 410 along a through-hole connection 421 to a bond pad 450 on the bottom interconnect layer 412. From the bond pad 451 the signal passes through connector 426 to a bond pad 455 on the top interconnect layer 413 of the capacitor substrate 419. From the bond pad 455 the drain signal passes along a through-hole connection 427 to the bond pad 461 on the bottom interconnect layer 414 of the capacitor substrate 419. From the bond pad 461 the signal passes through a connector 476 to a bond pad 477 on the top interconnect layer 415 of the resistor substrate 420. From the bond pad 477 a signal passes through the resistor substrate 420 along a through-hole connection 438 to a bond pad 478 on the bottom interconnect layer 416 of the resistor substrate 420. From the bond pad 478 the drain signal passes through a connector 479 to a bond pad 480 in the top interconnect layer 417 of the power substrate 421 where it is connected to the power supply VCC. As described above for connecting the resistor 405 to VCC, connection to the power supply VCC may also be accomplished through a top interconnect layer having signal lines that connect to an external power supply VCC.

The bond pads in the interconnect layers are arranged in an identical pattern, in particular, bond pads 446, 441, 442, 440, 447 in the top interconnect layer 411, the bond pads 448, 449, 450, 451, 452 on the bottom interconnect layer 412 are arranged in an identical pattern. Similarly, the bond pads in the top interconnect layer 413, the bottom interconnect layer. 414, the top interconnect layer 415, the bottom interconnect layer 416 and the top interconnect layer 417 are also arranged in an identical pattern to those of the top interconnect layer 411. Because of the identical nature of interconnecting the substrates, the connectors 463, 453, 481, 483 are used to connect adjacent bond pads even though these pads are not electrically used. In particular, the connector 483 connects corresponding bond pad 482 and the bottom interconnect layer 416 of the resistor substrate 420 to a corresponding bond pad 480 in the top interconnect layer 417 of the power substrate 421. These bond pads and the corresponding connector are not electrically connected to any portion of the circuit in this example.

FIG. 4c shows how the gate signal travels via the signal connection substrate 410 to the capacitor substrate 419, where it is connected to a first terminal of a capacitor 406, and how a second terminal of the capacitor 406 is connected to ground. FIG. 4c also shows how the gate signal travels to the resistor substrate 420, where it is connected to one end of a resistor 405, and how the other end of the resistor 405 is connected to the power supply VCC. FIG. 4c also shows how the source signal from the transistor 401 travels through the signal connection substrate 410, the capacitor substrate 419 and the resistor substrate 420, bypassing the resistor 405, until it is connected to the power supply VCC. FIG. 4c also shows how the drain from the transistor travels through the signal connection substrate 410, the capacitor substrate 419, bypassing the capacitor 406, and the resistor substrate 420 until it is connected to ground.

Since the signal connection substrate 410 does not provide interconnections between bond pads that are not opposite each other on the substrate in the above embodiment, it can be eliminated from this specific implementation without altering the top interconnect layer of the capacitor substrate and with no difference in the circuit (except shorter signal lengths). However, in other implementations, the signal connection substrate 410 can be used to provide connections to other chips, or different I/O pins of the same chip, or translation to bond pads that are not opposite.

Figure 7:
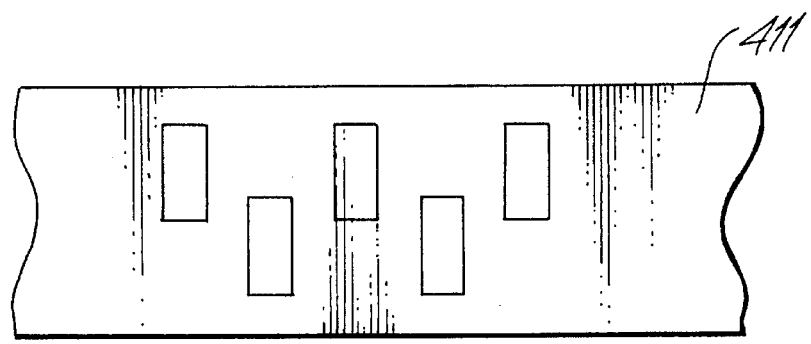
FIG. 7 illustrates schematically a plan view of an exemplary pattern of contacts in each of the top and bottom interconnection layers.

The interconnect layers 411, 412, 413, 414, 415, 416 and 417 are shown in FIG. 4b to have identical patterns of bond pads. FIG. 7 is a top view showing an example of such patterns. Any one of very many spatial distributions of bond pads may be used, the patterns on each substrate being identical.

Figure 4D:
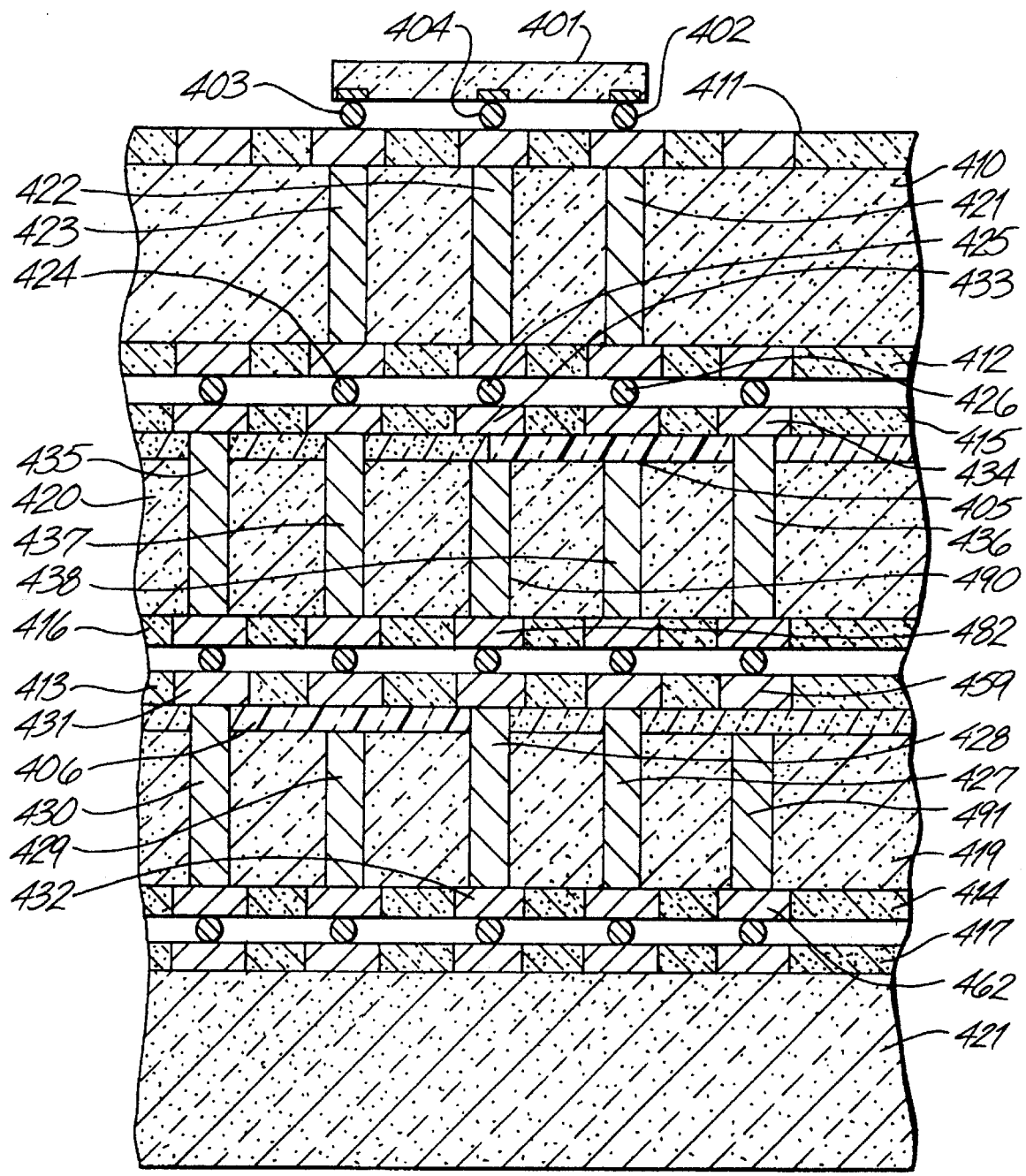
FIG. 4d is a cross sectional view of a device in which the capacitor substrate 419 and the resistor substrate 420 are interchanged from that of the device shown in FIG. 4b.

FIG. 4d is a cross sectional view of a device in which the capacitor substrate 419 and the resistor substrate 420 are interchanged from that of the device shown in FIG. 4b. In this implementation, the resistor substrate is closer to the field effect transistor 401 than the capacitor substrate. Schematically, however, the circuit of FIG. 4d is identical to the circuit of FIG. 4b which is shown in the schematic diagram of FIG. 4a. The resistor substrate of FIG. 4d is identical to that of FIG. 4b except it has a through-hole connection 490 between the bond pad 433 on the top layer and the bond pad 482 on the bottom interconnection layer. Similarly, the capacitor substrate is identical to that of FIG. 4b except that it has a through-hole connection 491 between the bond pad 454 on the top interconnect layer 413 and the bond pad 462 on the bottom interconnect layer 414 of the capacitor substrate. However, because the interconnection layers are identical, no changes are required to the pattern of bond pads.

Figure 4E:
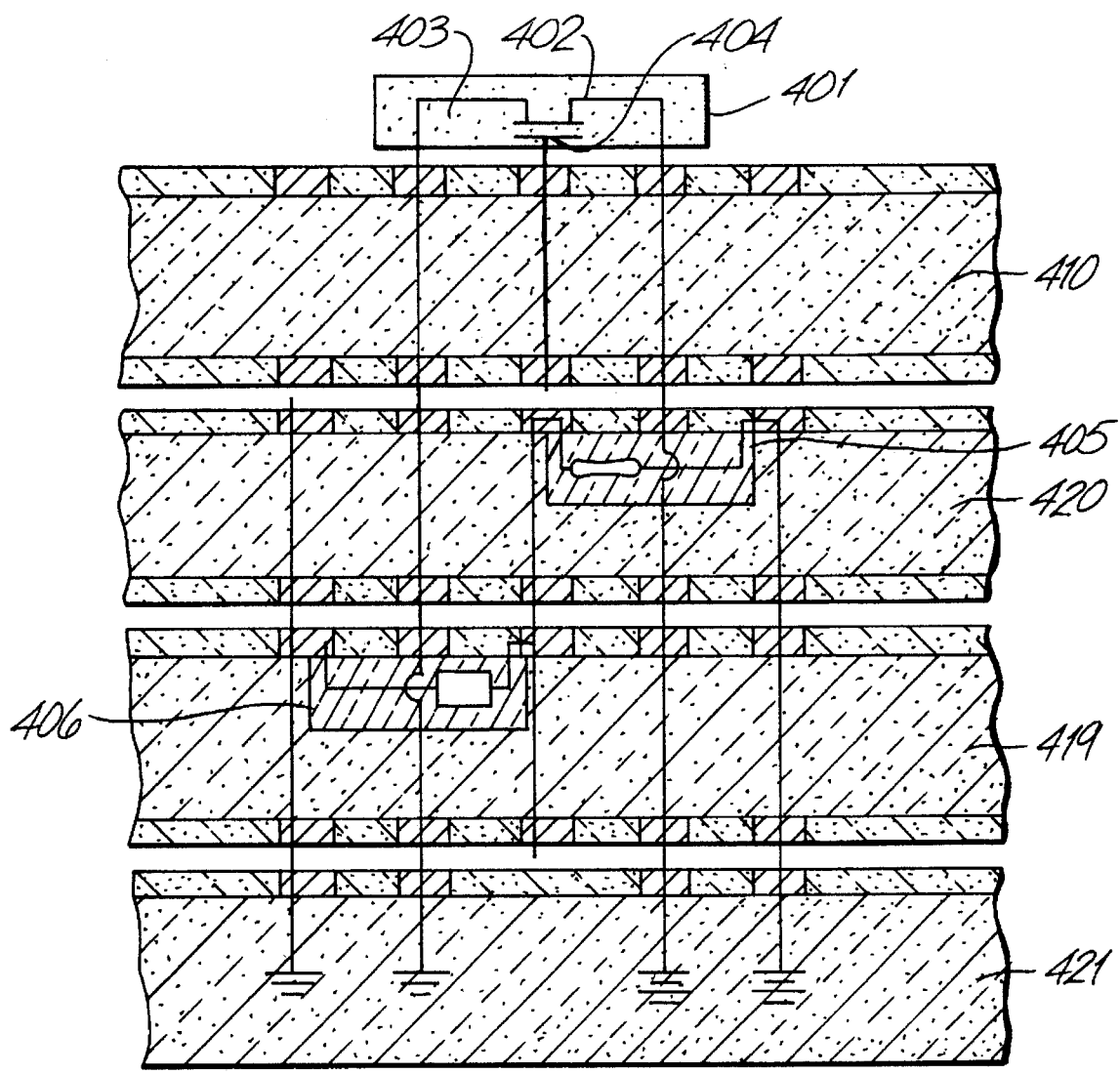
FIG. 4e is an alternate schematic illustration of the structure of FIG. 4d to more clearly show how the circuit 400 of FIG. 4a is formed by the structure of FIG. 4d.

FIG. 4e is an alternate schematic illustration of the structure of FIG. 4d to more clearly show how the circuit 400 of FIG. 4a is formed by the structure of FIG. 4d. FIG. 4e shows how the gate terminal 402 is connected via the signal connection substrate 410 to the capacitor substrate 420 where it is connected to a first terminal of the resistor 405 and is connected through the resistor substrate 420 to the capacitor substrate where it is connected to a first terminal of the capacitor 406. FIG. 4e also shows how the drain terminal 402 is connected via the signal connector substrate 410, the resistor substrate 420, and the capacitor substrate 419 to the power supply VCC in the power substrate 421. FIG. 4e also shows how the source terminal 403 is similarly connected via the signal connector substrate 410, the resistor substrate 420, and the capacitor substrate 419 to ground in the power substrate 421.

Another exemplary implementation of the present invention is now described with reference to FIGS. 6a and 6b. This exemplary implementation is provided to illustrate how a semiconductor device without the capacitor and resistor layers is formed.

Figure 6A:
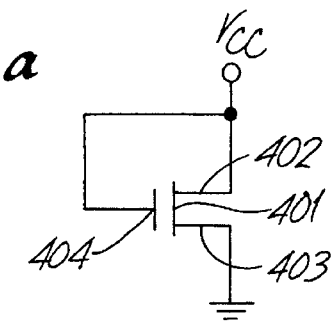
FIGS. 6a and 6b show schematically another exemplary implementation of the present invention.

FIG. 6a is a schematic circuit diagram of a device 600 which comprises a field effect transistor 401 having a drain terminal 402, a source terminal 403 and a gate terminal 404. The gate terminal 404 and the drain terminal 402 of the device 600 are connected to the power supply VCC. The source terminal 403 is connected to ground.

Figure 6B:
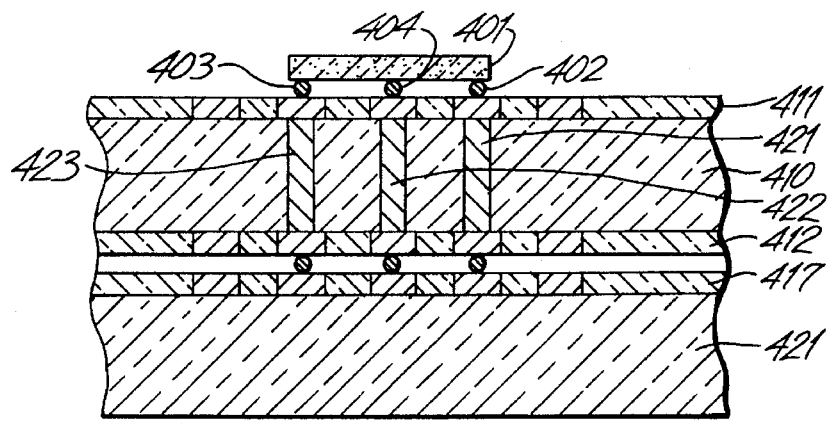

FIG. 6b illustrates how the device 600 can be implemented according to the present invention. The field effect transistor 401 is fabricated on a semiconductor chip 401 which is bonded to the top interconnect layer 411 of the signal connection substrate 410. Similar to the signal connection substrate shown in FIGS. 4a–4c, no interconnection is made within the signal connection substrate 410. The three terminals 402, 403 and 404 of the field effect transistor 401 pass from the top interconnect layer 411 of the signal connection substrate 410, by way of three separate through-hole connections 421, 422, 423 to the bottom interconnect layer 412.

At the bottom interconnect layer 412, the gate, source and drain are connected to respective bond pads on the top interconnect layer 417 of the power supply substrate 421. Within the power supply substrate 421, the gate and the drain are connected to the power supply VCC and the source is connected to ground.

Figure 6C:
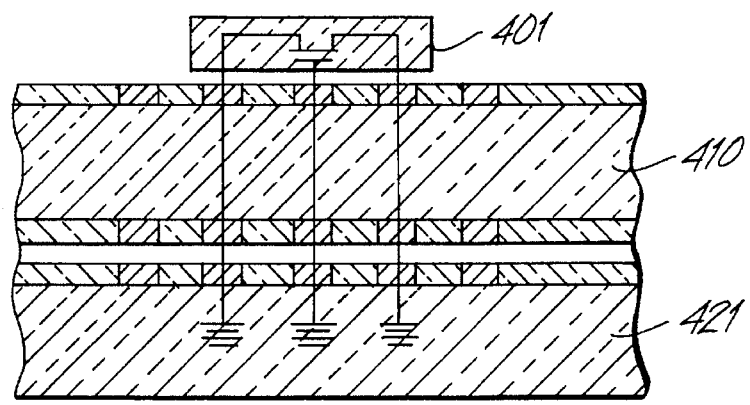
FIG. 6c is an alternate schematic illustration of how the circuit of FIG. 6a is formed in the structure of FIG. 6b.

FIG. 6c is an alternate illustration of the structure of FIG. 6b. The figure shows schematically how the circuit 600 of FIG. 6a is formed by the structure of FIG. 6b.

Figure 5:
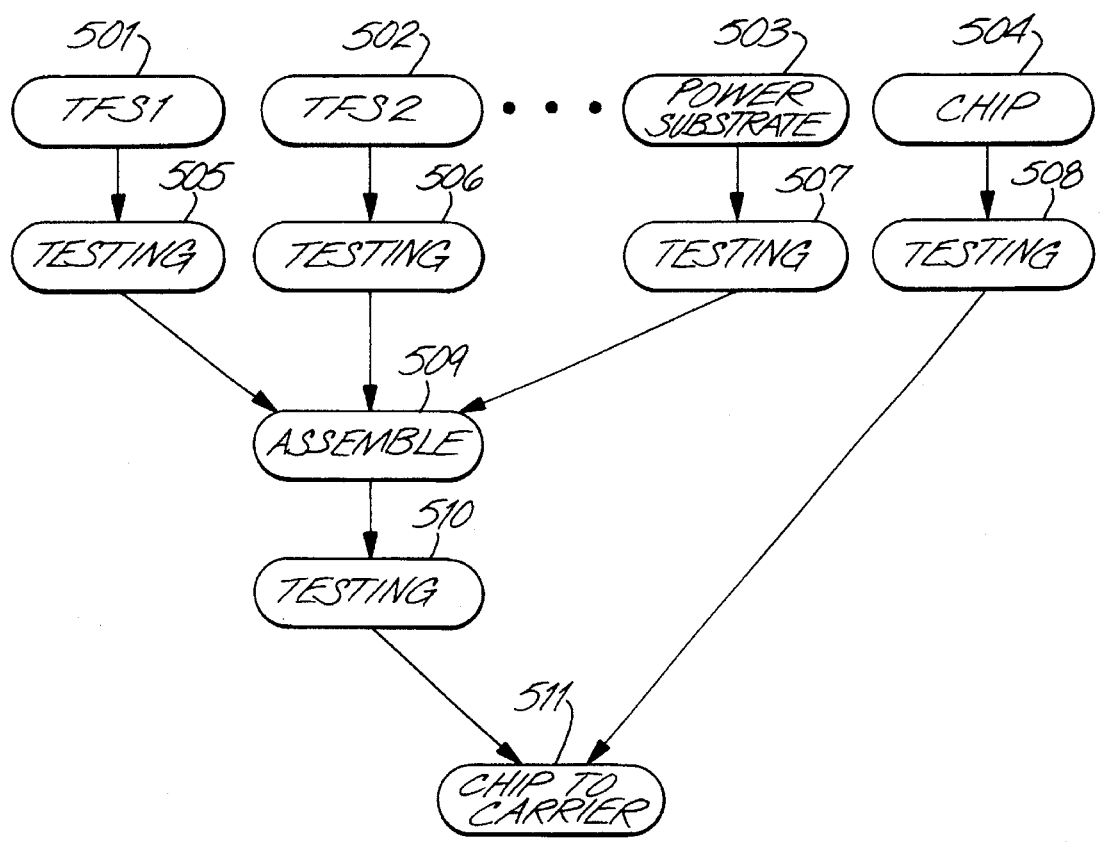
FIG. 5 is a flow chart illustrating how the present invention can accelerate manufacturing of a semiconductor device.

FIG. 5 is a flow chart illustrating how the present invention can accelerate manufacturing of a semiconductor device. Steps 501, 502, 503 and 504 depict the different thin film functional substrates (TFS1 and TFS2) and the power supply substrate, being manufactured in parallel with the manufacturing of semiconductor chip(s). Steps 505, 506, 507 and 508 depict the different functional substrates and chips being tested in parallel with the testing of the power supply substrate and the semiconductor chip. In step 509, the functional substrates, including the power substrate are assembled to form a carrier. Thereafter in step 510, the assembled carrier is retested. Upon satisfactory passing of the test in step 510, the chip(s) are then placed onto and attached to the carrier to form the final device.

As the substrates and the chips are manufactured and tested in parallel, manufacturing time of a device is reduced. More significantly, by testing the chip(s) and substrates individually before final assembly thereof into a device, overall yield of the manufacturing process is increased.

Figure 8:
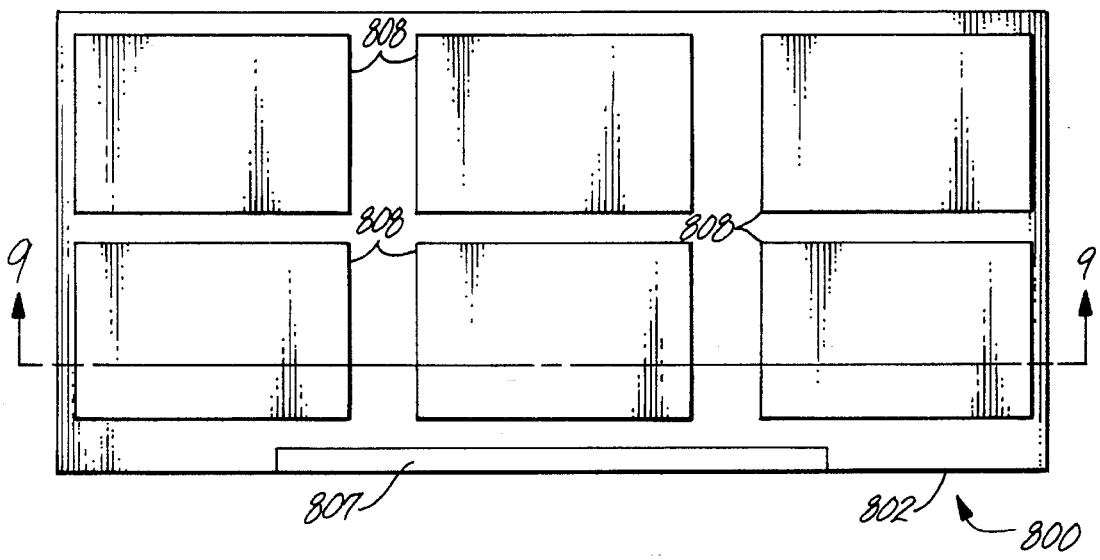
FIG. 8 is a top plan view showing a fully populated multi-chip/module (MCM) according to principles of the invention.

FIG. 8 is a top plan view showing a fully populated multi-chip module (MCM) according to principles of the invention.

Figure 9:
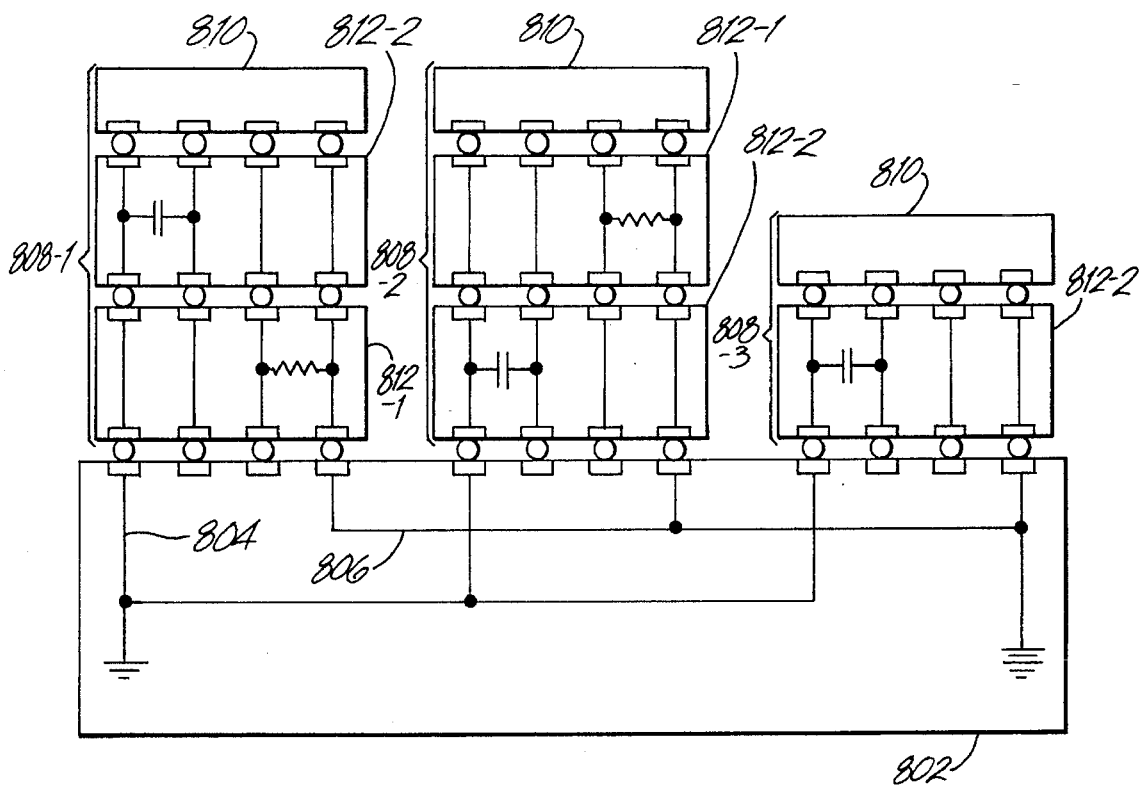
FIG. 9 is a schematic cross-sectional view of the MCM taken along line 9—9 of FIG. 8 showing integrated circuit elements constructed according to principles of the invention.
Figure 10:
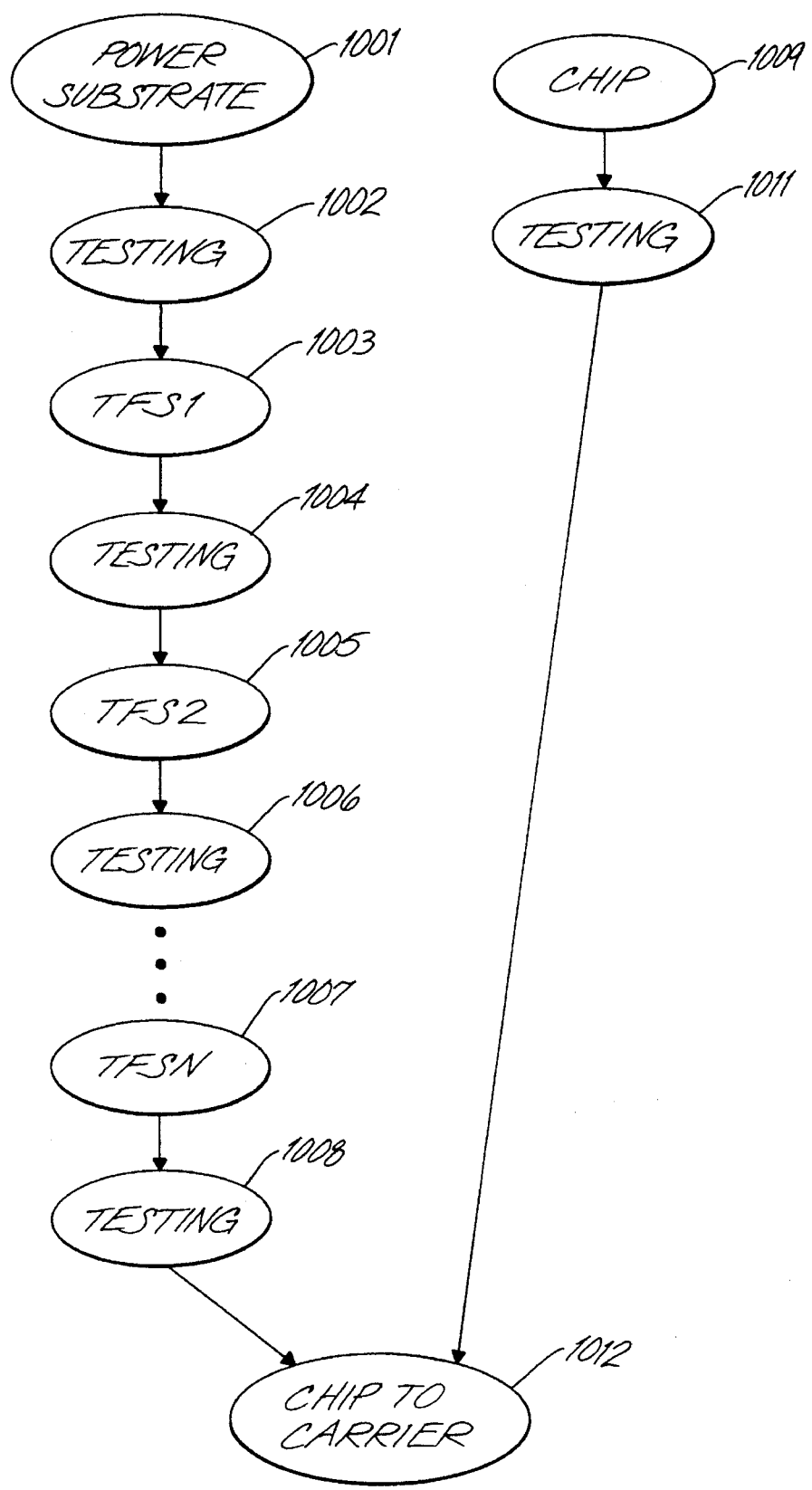
FIG. 10 is a flow chart illustrating the prior art of manufacturing multi-chip modules using a deposition method (MCM-D).
Figure 11:
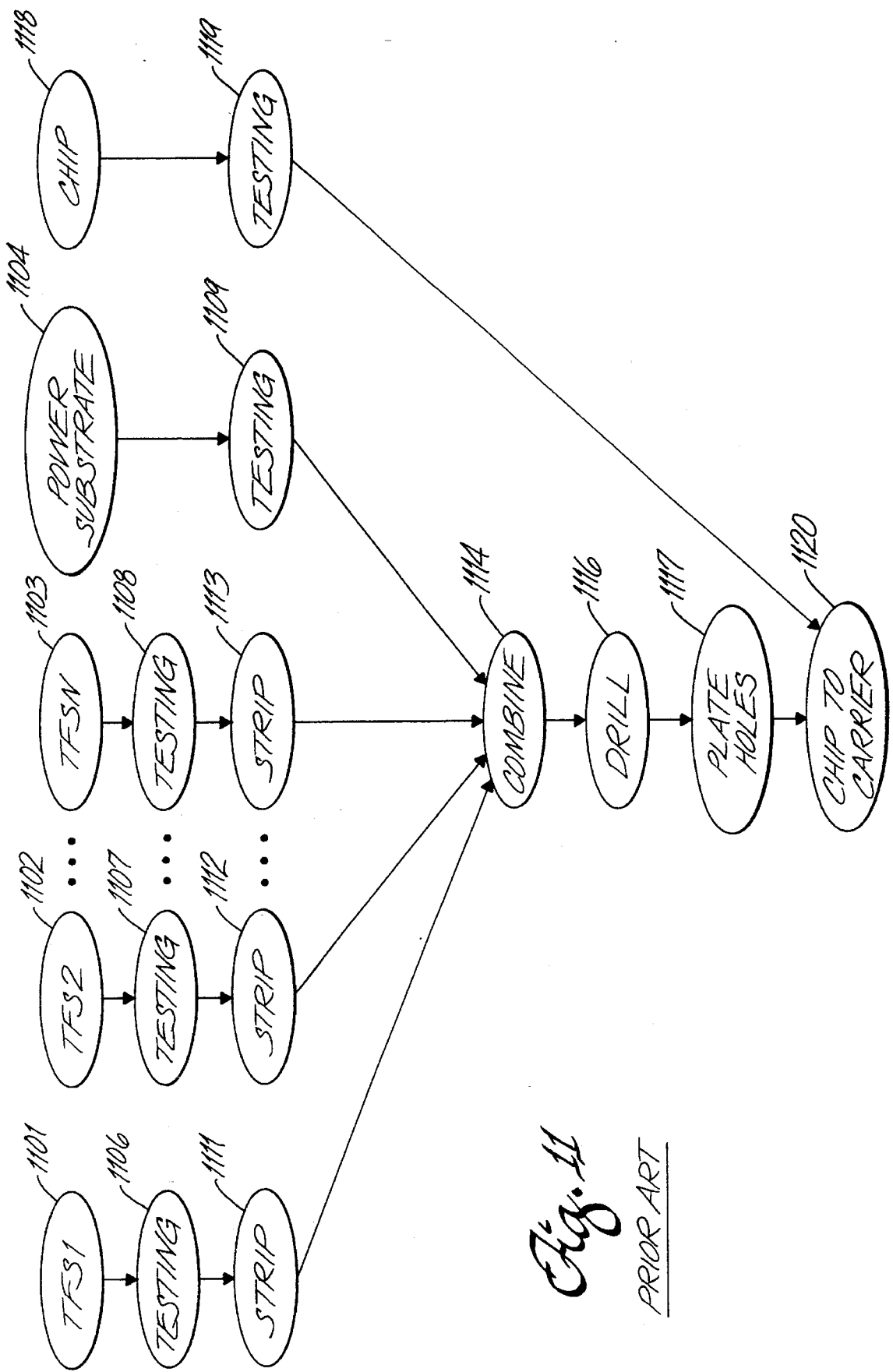
FIG. 11 is a flow chart illustrating the prior art of fabricating a multi-chip module using a laminated method (MCM-L).

FIG. 9 is a cross-sectional view of the MCM taken along line 9—9 of FIG. 8 showing integrated circuit elements constructed according to principles of the invention.

A multi-chip module 800 comprises a multi-layer interconnection substrate 802 having a plurality of signal traces 804, 806 (shown in FIG. 9) for communicating electrical signals between integrated circuit elements. Although the signal traces 804, 806 are shown as ground and power respectively for the interconnection substrate 802, this is for illustrative purposes only. The traces may also carry other electrical signals, such as clocks, control signals, address buses or data buses. The interconnection substrate 802 preferably comprises a multi-layer ceramic dielectric body portion having electrical interconnects for translating electric signals. Alternatively, the interconnection substrate comprises a printed wiring board. A connector interface 807 is on the top surface of the interconnection substrate 802. The connector interface 807 has a plurality of pads (not shown) for electrically interfacing with an external connector.

Each integrated circuit element 808 comprises a chip and a plurality of functional substrates assembled together to form a carrier as described above. A connector pad region has a plurality of bond pads for coupling to a connector (not shown) for communicating electrical signals between the multi-chip module and an external electronic device such as other multi-chip modules, computer keyboards, terminals, printers, disks and other input/output devices or interfaces. Although six integrated circuit elements are shown in FIG. 8, the invention is not so limited. The integrated circuits are typically processor devices, such as gate array processors, or memory devices.

Referring now to FIG. 9, three integrated circuit 808 elements are illustrated. Each integrated circuit element comprises a semiconductor chip 810 and a plurality of functional substrates 812. A first integrated circuit element 808-1 has a resistor substrate 812-1 mounted to a first portion of the top surface of the interconnection substrate 802. A capacitor substrate 812-2 is mounted to the top surface of the resistor substrate 812-1. A semiconductor chip 810 is mounted to the top surface of the capacitor substrate 812-2. A second integrated circuit element. 802-2 has a capacitor substrate 812-2 mounted to the top surface of the interconnection substrate 802 in contrast to the first integrated circuit element 808-1 which has a resistor substrate 812-1 mounted to the interconnection substrate 802. The second integrated circuit element 808-2 has a resistor substrate 812-1 mounted on a second portion of the top surface of the capacitor substrate 812-2. A semiconductor chip 810 is mounted to the top surface of the resistor substrate 812-1. A third integrated circuit element 808-3 has one substrate layer, a capacitor substrate 812-2, mounted to a third portion of the top surface of the interconnection substrate 802 and a semiconductor chip 810 mounted on the top surface of the capacitor substrate 812-2. Interconnections between the bond pads of the semiconductor chips and the substrate layers are not shown in FIG. 9 for simplicity and clarity. These interconnections are formed as described above in connection with FIGS. 3–4.

By employing an identical interconnect layer having an identical grid of bond pads, the substrate layers of the integrated circuits may be interchanged without the necessity of redesigning the interconnect layer, although the interconnections within the substrate may need to be redesigned or modified for assembling different circuits.

The description of the particular embodiments is given above for the understanding of the present invention. It will be understood that various modifications and additions can be made without substantially departing from the scope of the present invention. For example, the above specific embodiments are illustrated with the functional substrates 419, 420 having only one type of electrical elements. It will be understood that different types of elements can be formed in a functional substrate. Therefore, while the invention is illustrated with the above embodiments, the scope of the present invention is defined by the following claims.

What is claimed is:

1. A multi-chip module, comprising:

an interconnection substrate for accommodating at least one integrated circuit element thereon, where each integrated circuit element comprises:

at least one first substrate having a bottom interconnect layer that is coupled to the interconnection substrate and having a single type of predetermined passive electrical functional elements, wherein the passive electrical functional elements are selected from the group consisting of electrical signal conductors, capacitors, and resistors; and at least one second substrate having a bottom interconnect layer that is coupled to a top interconnect layer of the first substrate, said second substrate capable of being independently created and having a single type of predetermined passive electrical functional elements, wherein the electrical functional elements of the second substrate are selected from the group consisting of electrical signal connectors, capacitors, and resistors, wherein the electrical functional elements of the second substrate are of a type different than the electrical functional elements of the first substrate, wherein at least one semiconductor chip is coupled to a top interconnect layer of the second substrate, and wherein integrated circuits of said semiconductor chip are in electrical contact with the electrical functional elements of the first and second substrate; and a plurality of intra-substrate connectors interposed between corresponding top and bottom interconnect layers, wherein the top and bottom interconnect layers have substantially identical patterns of electrical contacts.

2. A multi-chip module as claimed in claim 1, wherein said intra-substrate connectors are through-hole connectors.

3. A multi-chip module as claimed in claim 1, wherein said electrical contacts are selected from the group consisting of solder bumps, elastomer bumps and gold bumps.

4. An integrated circuit device as claimed in claim 1, wherein said at least one second substrate includes a substrate of power supply circuits.

5. A multi-chip module comprising:

an interconnection substrate; and a plurality of integrated circuit elements, each integrated circuit element being coupled to the interconnection substrate, wherein each integrated circuit element includes:

a semiconductor chip; and at least one functional substrate, wherein each functional substrate comprises a single type of passive electrical functional elements wherein each functional substrate in each integrated circuit, element includes different types of passive electrical functional elements, wherein at least one functional substrate is coupled to the interconnection substrate, wherein the semiconductor chip is coupled to a functional substrate, and wherein the electrical functional elements of each functional substrate are in electrical contact with the semiconductor chip.

6. The multi-chip module of claim 5 wherein each functional substrate comprises a top interconnect layer, a bottom interconnect layer and a plurality of intra-substrate connectors.

7. The multi-chip module of claim 6, wherein the top interconnect layer and the bottom interconnect layer are substantially identical.

8. The multi-chip module of claim 6, wherein the top interconnect layer and the bottom interconnect layer have substantially identical patterns of intra-substrate connectors.

9. An inventory for assembling a multi-chip module for accommodating a plurality of integrated circuit elements, wherein the inventory comprises a plurality of each of the following:

(a) a resistor substrate incorporating a plurality of thin film resistors formed on the substrate and a plurality of bonding pads on each face of the resistor substrate, the resistors being connected to at least a portion of the bonding pads;

(b) a capacitor substrate incorporating a plurality of thin film capacitors formed on the substrate and a plurality of bonding pads on each face of the capacitor substrate, the capacitors being connected to at least a portion of the bonding pads;

(c) an interconnection substrate comprising a plurality of bonding pads on at least one face of the interconnection substrate, and interconnections on the substrate making electrical connections between at least a portion of the bonding pads; and (d) integrated circuit chips adapted to be carried by one of the resistor or capacitor substrate, and having bonding pads connected to bonding pads of the carrying substrate, wherein the bonding pads on each face of each substrate and bonding pads on each integrated circuit chip are in an identical pattern for face-to-face interconnection.

10. The multi-chip module of claim 5, wherein the passive electrical functional elements for each functional substrate are selected from the group consisting of resistors, capacitors, and electrical signal conductors.

11. A multi-chip module comprising:

an interconnection substrate having a plurality of signal traces;

a plurality of integrated circuit elements connected with the interconnection substrate, wherein each integrated circuit element comprises:

a first functional substrate comprising a plurality of passive functional electrical elements of a single type and coupled to the interconnection substrate;

at least one second functional substrate comprising a plurality of passive functional electrical elements of a single type, wherein the functional elements of each second functional substrate are different than the functional elements in both the first functional substrate and other second functional substrates, wherein at least one second functional substrate is coupled to first functional substrate; and a semiconductor chip of integrated circuits carried by a second functional substrate and in electrical contact with the functional electrical elements of the first functional substrate and each second functional substrate.

12. The multi-chip module as recited in claim 11 comprising:

a top layer on a top surface of each first and second functional substrate;

a bottom interconnect layer on a bottom surface of each first and second functional substrate; and a plurality of intra-substrate electrical connectors arranged in each top and bottom interconnect layer in a substantially identical pattern to facilitate interchanging attachment between the second and first functional substrates.

13. The multi-chip module as recited in claim 11 wherein each first and second functional substrate comprises passive functional electrical elements selected from the group consisting of resistors, capacitors, and electrical signal conductors.

* * * * *

UNITED STATES PATENT AND TRADEMARK OFFICE
CERTIFICATE OF CORRECTION

PATENT NO. : 5,475,262
DATED : December 12, 1995
INVENTOR(S) : Wen-chou V. Wang; William T. Chou It is certified that error appears in the above-indentified patent and that said Letters Patent is hereby corrected as shown below:

```
ABSTRACT, line 15, change "layers. Although" to
            -- layers, although --.
Column 4, line 5, change "multi-chip/module" to
            -- multi-chip module --.
Column 9, line 57, after "layer" delete the period.
Column 12, line 33, after "element" delete the period.
```

Signed and Sealed this

Twelfth Day of November, 1996

Attest:

BRUCE LEHMAN

*Attesting Officer*   Commissioner of Patents and Trademarks